United States Patent [19]
Masuda et al.

[11] Patent Number: 5,447,801
[45] Date of Patent: Sep. 5, 1995

[54] TARGET FOR MAGNETO-OPTICAL RECORDING MEDIA AND METHOD FOR PRODUCING SAME

[75] Inventors: Kaoru Masuda, Yasugi, Japan; Shunichiro Matsumoto, Fremont, Calif.

[73] Assignee: Hitachi Metals, Ltd., Tokyo, Japan

[21] Appl. No.: 163,550

[22] Filed: Dec. 9, 1993

[30] Foreign Application Priority Data

Dec. 17, 1992 [JP] Japan ................................. 4-355007

[51] Int. Cl.[6] ............................................... B22F 7/00
[52] U.S. Cl. .................................... 428/567; 75/246; 428/546; 428/548; 419/48
[58] Field of Search .......................... 75/246; 419/48; 428/546, 548, 567

[56] References Cited

U.S. PATENT DOCUMENTS

| | | | |
|---|---|---|---|
| 4,957,549 | 9/1990 | Matsumoto | 75/246 |
| 4,992,095 | 2/1991 | Nate et al. | 75/246 |
| 5,062,885 | 11/1991 | Matsumoto | 75/255 |
| 5,098,529 | 3/1992 | Feldhues | 204/59 R |

FOREIGN PATENT DOCUMENTS

| | | |
|---|---|---|
| 3935698 | 5/1990 | Germany . |
| 1242733 | 9/1989 | Japan . |
| 1247571 | 10/1989 | Japan . |
| 2138463 | 8/1990 | Japan . |
| 5271915 | 10/1993 | Japan . |
| 5320888 | 3/1994 | Japan . |

OTHER PUBLICATIONS

I.E.E.E. Transactions on Magnetics, vol. 24, No. 6, Nov. 1988, New York, pp. 2443–2445, T. Nate, T. Morimoto, S. Endoh, K. Oka, "Preparation of the Alloy Target for Magneto-Optical Recording Media".

*Primary Examiner*—Donald P. Walsh
*Assistant Examiner*—John N. Greaves
*Attorney, Agent, or Firm*—Sughrue, Mion, Zinn, Macpeak & Seas

[57] ABSTRACT

A target for magneto-optical recording media having a microstructure having a matrix phase of a eutectic structure of a rare earth metal and an iron-group metal, particles I made of a pure iron-group metal or an alloy thereof and having an average diameter of 200 μm or less and particles II made of a corrosion resistance-improving metal and an iron-group metal and having an average diameter of 200 μm or less is produced by mixing rapidly-quenched powder A made of the rare earth metal and the iron-group metal and having a eutectic structure with powder B made of a pure iron-group metal or an alloy thereof and having an average diameter of 200 μm or less, and powder C made of the corrosion resistance-improving metal and the iron-group metal and having an average diameter of 200 μm or less, and pressure-sintering the resulting mixed powder at a temperature lower than a liquid phase-appearing temperature.

7 Claims, 5 Drawing Sheets x 100 x 100

TARGET FOR MAGNETO-OPTICAL RECORDING MEDIA AND METHOD FOR PRODUCING SAME

BACKGROUND

The present invention relates to a target magneto-optical recording media mainly composed of rare earth metals and iron-group metals suitable for use in a magnetron-type sputtering apparatus, and a method for producing such a target.

As information to be recorded increases drastically in recent years, attention has been focused on magneto-optical disks as high-recording density, rewritable recording media. The magneto-optical disk is a type of magneto-optical recording media comprising a substrate made of a resin such as polycarbonate and a thin-film layer formed on the substrate by a sputtering method, the thin-film layer being made of an alloy of at least one rare earth metal and at least one iron-group metal such as an Tb-Fe-Co alloy. Writing and reading are conducted by utilizing a laser beam.

Sputtering targets usable for the production of such magneto-optical recording media are required to provide a thin-film layers in which the concentrations of rare earth metals do not change from place to place; namely it is required that the targets have uniform rare earth metal distributions in a plane (in a lateral direction).

The inventors previously proposed a target comprising a matrix phase composed of a eutectic structure consisting of at least one rare earth metal and at least one iron-group metal, and iron-group metal particles bonded to the matrix phase via a thin intermetallic compound phase, thereby having an increased uniformity in the in-plane distributions of rare earth metals, and good mechanical workability and sinterability (Japanese Patent Laid Open No. 1-143255).

Since a magneto-optical recording layer made of rare earth metals and iron-group metals is extremely active in corrosion and oxidation, such elements as Ti, Al, Cu, Cr, Nb, Ta, Pd or Pt should be added to the recording layer in order to improve a corrosion resistance thereof. The inventors proposed in Japanese Patent Laid-Open No. 1-247571 a target produced by adding such elements to the target of Japanese Patent Laid-Open No. 1-143255.

In a magnetron-type sputtering apparatus widely used for the production of magneto-optical recording media recently, a permanent magnet is disposed behind a target so that a magnetic flux leaks from a surface of the target to concentrate a high-density plasma in the vicinity of the target surface. By this structure, a high film-forming speed and an improved energy efficiency can be achieved.

The target for magneto-optical recording media as disclosed in Japanese Patent Laid-Open Nos. 1-143255 and 1-247571 show high permeability because their metal structures contain ferromagnetic iron-group metals. Accordingly, most magnetic flux generated from the permanent magnet behind the target forms a closed magnetic circuit passing though the interior of the target in the above-described magnetron-type sputtering apparatus. As a result, the magnetic flux leaking from the surface of the target decreases, resulting in a low film-forming speed and non-uniform erosion, which in turn lead to a low utilization factor of the target. Accordingly, the targets having the above structures fail to exhibit the desired performance of the magnetron-type sputtering apparatus.

SUMMARY

Accordingly, an object of the present invention is to provide a target suitable for a magnetron-type sputtering apparatus without deteriorating the advantages of the targets of Japanese Patent Laid-Open Nos. 1-143255 and 1-247571, such as uniform thin-film composition and good machinability.

Another object of the present invention is to provide a method for producing such a target.

As a result of intense research in view of the above objects, the inventors have found that by adding elements for improving the corrosion resistance of a thin-film layer in the form of an alloy with an iron-group metal, the saturation magnetization and permeability of the target can be reduced as compared with a case where each corrosion resistance-improving element is added separately. The inventors further have found that by controlling iron-group metal particles having ferromagnetism and alloy particles of iron-group metals and the above elements for improving the corrosion resistance of a thin-film layer such that their average diameter is restricted to 200 μm or less, the maximum permeability of the target can be lowered. The present invention has been completed based on these findings.

Thus, the target for magneto-optical recording media according to the present invention is constituted by a sintered body having a microstructure having as a matrix phase a eutectic structure of at least one rare earth metal and at least one iron-group metal, in which first particles made of a pure iron-group metal or an alloy thereof and having an average diameter of 200 μm or less (hereinafter referred to as "particles I"), and second particles made of at least one metal selected from the group consisting of Ti, Al, Cu, Cr, Nb, Ta, Pd and Pt (hereinafter referred to as "corrosion resistance-improving metal") and at least one iron-group metal and having an average diameter of 200 μm or less (hereinafter referred to as "particles II") are uniformly dispersed, the sintered body having a maximum permeability of 25 or less.

The method for producing a target for magneto-optical recording media according to the present invention comprises the steps of;

(a) rapid-quenching a melt of at least one rare earth metal and at least one iron-group metal to form first powder having a eutectic structure (hereinafter referred to as "powder A");

(b) mixing the powder A with second powder made of a pure iron-group metal or an alloy thereof and having an average diameter of 200 μm or less (hereinafter referred to as "powder B"), and third powder made of at least one metal selected from the group consisting of Ti, Al, Cu, Cr, Nb, Ta, Pd and Pt and at least one iron-group metal and having an average diameter of 200 μm or less (hereinafter referred to as "powder C"); and (c) pressure-sintering the resulting mixed powder at a temperature lower than a liquid phase-appearing temperature.

DETAILED DESCRIPTION OF THE INVENTION

[1] Target

Figure 3:
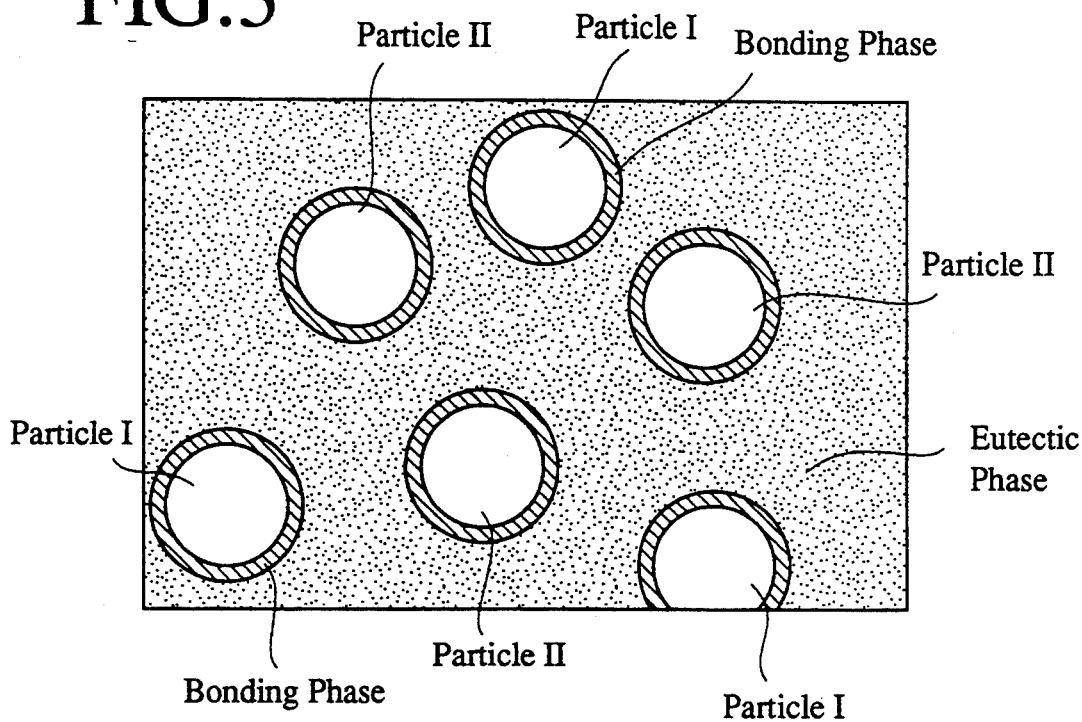
FIG. 3 is a schematic view showing the microstructure of the target of the present invention.

The target of the present invention typically has a microstructure schematically shown in FIG. 3. Namely, the target of the present invention has a microstructure in which particles I and particles II each encircled by a thin bonding phase are uniformly dispersed in a matrix phase composed of a eutectic structure.

The term "eutectic structure" used herein means a metal structure in which at least one rare earth metal and at least one iron-group metal exist in a proportion range from an intermetallic compound composition in which an atomic ratio of the rare earth metal to the iron-group metal is 1:2 to a composition in which the rare earth metal is less than 100 atomic %. Specifically in a binary system of Fe and Tb, the amount of Tb is 33.4 atomic % or more and less than 100 atomic %, preferably 45–75 atomic %.

The eutectic structure of the target of the present invention is a fine structure consisting of an intermetallic compound and an α-rare earth metal phase. Such a fine structure functions to alleviate the non-uniformity of an angle at which rare earth metal particles are scattered from the target in the process of sputtering, thereby making uniform the distributions of the rare earth metals in the resulting thin-film layers.

The particles I are made of a pure iron-group metal or an alloy thereof, and the particles II are made of an alloy of at least one corrosion resistance-improving metal and at least one iron-group metal. The amount of the particles I is preferably 5–30 weight %, and more preferably 7–20 weight % based on the target. The amount of the particles II is preferably 10–50 weight %, and more preferably 15–40 weight % based on the target.

By regulating the average diameter of ferromagnetic particles I and particles II dispersed in the eutectic structure to 200 μm or less, preferably 125 μm or less, more preferably 80 μm or less, the maximum permeability of the target can be increased. In this case, the maximum diameter of the ferromagnetic particles I and particles II is preferably regulated to 150 μm or less. By making the ferromagnetic particles finer, grain boundaries existing in the microstructure increase, making it difficult for magnetic flux to pass through the target. As a result, the maximum permeability and saturation magnetization of the target decrease. Incidentally, the average diameter is determined as a $D_{50}$ value from a sieved distribution curve based on the weight of the starting powder.

At least one metal selected from the group consisting of Ti, Al, Cu, Cr, Nb, Ta, Pd and Pt is added as the corrosion resistance-improving metal which functions to impart corrosion resistance to the resulting thin-film layer. Since the addition of too much corrosion resistance-improving metal would lead to the deterioration of magnetic properties of the resulting thin-film layer, the amount of the corrosion resistance-improving metal added is preferably 15 atomic % or less, and more preferably 2–8 atomic %, based on the target.

These corrosion resistance-improving metals are added in the form of their alloys with at least one iron-group metal. This alloying provides, in addition to the above effect of decreasing the maximum permeability and the saturation magnetization, the following effects:

First, the corrosion resistance-improving metal is less likely to be segregated in the target as compared with a case in which it is added in the form of pure metal powder, thereby making the in-plane distribution of corrosion resistance-improving metal uniform. Also, uneven distribution of corrosion resistance-improving metal in the thin-film layer formed from such a target can be avoided.

Since Ti, Nb and Ta among the corrosion resistance-improving metals can be alloyed with at least one iron-group metal to provide eutectic alloys having low melting temperatures, the sinterability can be improved as compared with a case in which they are added in the form of pure metal powder.

The particles I and the particles II dispersed in the target tend to form an intermetallic compound by reaction with the rare earth metals existing in the eutectic structure. Accordingly, it is necessary to suppress the formation of the intermetallic compound at such a degree that the eutectic structure necessary for keeping the distribution of the rare earth metal uniform is not destroyed. For this purpose, the bonding phase formed between the eutectic structure and the particles I and II is preferably 30 μm or less, and more preferably 10 μm or less.

[2] Production of Target

The target of the present invention may be produced by mixing powder having a eutectic structure formed from at least one rare earth metal and at least one iron-group metal by rapid quenching (powder A), powder made of a pure iron-group metal or an alloy thereof and having an average diameter of 200 μm or less (powder B), and powder made of at least one corrosion resistance-improving metal and at least one iron-group metal and having an average diameter of 200 μm or less (powder C), and pressure-sintering the resultant mixed powder at a temperature lower than a liquid phase-appearing temperature.

The term "powder B" used herein generally means powder made of a pure iron-group metal such as Fe, Co, Ni alone, or an alloy of these iron-group metals such as an Fe-Co alloy. The term "powder C" used herein generally means alloy powder made of at least one corrosion resistance-improving metal selected from the group consisting of Ti, Al, Cu, Cr, Nb, Ta, Pd and Pt and at least one iron-group metal, such as an Fe-Cr alloy, an Fe-Nb alloy, an Fe-Ta alloy, an Fe-Cr-Ti alloy, etc.

By regulating the particle sizes of powder A, powder B and powder C, non-uniform distributions of these powders can be prevented at the step of mixing these powders. Specifically, the average diameter of the powder A is preferably 125 µm or less, and more preferably 40–80 µm. The average diameter of the powder B is preferably 200 µm or less, more preferably 125 µm or less, and particularly 1–80 µm. The average diameter of the powder C is preferably 200 µm or less, more preferably 125 µm or less, and particularly 1–80 µm.

With such fine powders A, B and C, the resultant target has a preferred microstructure in which ferromagnetic particles I formed from powder B and particles II formed from powder C are uniformly dispersed. By this microstructure, magnetic flux passing through the target in the process of magnetron sputtering is extremely uniform, resulting in a uniformly sputtered thin-film layer.

The starting powder preferably meets the requirement that each of powder A, powder B and powder C has an average diameter within 20% of tolerance relative to an average diameter of a mixture of powder A, powder B and powder C. By using such starting powder, it is possible to obtain a target meeting the requirement that an average diameter of each of particles I and particles II is within 20% of tolerance relative to an average diameter of a mixture of particles I and particles II.

By alloying corrosion resistance-improving metals with at least one iron-group metal in the powder C, a maximum permeability of the target is reduced as compared with a case in which the corrosion resistance-improving metals and iron-group metals are added in the form of separate powders. The decrease in maximum permeability by alloying appears to be due to the fact that the corrosion resistance-improving metal is replaced for the iron-group metal in a lattice, thereby weakening a ferromagnetic bonding.

The saturation magnetization is also decreased by this alloying. Incidentally, although the maximum permeability can be decreased by adding other metals, it is extremely efficient to add the corrosion resistance-improving metals because they function to improve the corrosion resistance of a target and decrease a maximum permeability thereof.

Since the alloy powder C of at least one iron-group metal and at least one corrosion resistance-improving metal having a low melting point can be easily produced referring to its phase diagram, the optimum composition of powder C can easily be determined such that it shows a low melting point.

In this case, if the amount of the iron-group metal is insufficient for the aimed composition, the iron-group metal may be added in the form of pure metal powder or alloy powder of two or more iron-group metals to adjust the amounts of the iron-group metals in the target composition.

The powder having a eutectic structure is obtained by rapid quenching, because the rapid-quenching treatment can provide a finer eutectic structure than a pulverization method. It is possible to regulate the oxygen content in the formed powder to 1,000 ppm or less in the rapid-quenching treatment. With such a low oxygen content, magnetic properties such as coercivity, Kerr rotation angle, etc. of the resulting thin-film layers can be improved and stabilized. Examples of such rapid-quenching treatments include a gas atomizing method, an electrode rotation method, a disc rotation method, etc.

The sintering temperature is lower than a liquid phase-appearing temperature. The reason therefor is as follows: If the liquid phase appears in the course of sintering, intermetallic compounds are formed rapidly between the eutectic structure and the particles I of the iron-group metal and/or the particles II of the corrosion resistance-improving metal and the iron-group metal, thereby destroying the eutectic structure.

Since the rare earth metal and the iron-group metal show the lowest melting point near a eutectic point thereof (for instance, eutectic point of Tb-Co: 690° C.), the sintering temperature is selected to be slightly lower than the eutectic point of the rare earth metal and the iron-group metal. Specifically, the sintering temperature is lower than the liquid phase-appearing temperature (eutectic point) and preferably higher than 500° C., for instance 600°–850° C.

The pressure sintering can be conducted by a hot-isostatic pressing (HIP) method, a hot-pressing (HP) method, a hot-pack rolling method, etc. To prevent the oxidation of the rare earth metal which is extremely reactive at the sintering temperature, the sintering is preferably conducted in vacuum or in an inert gas atmosphere.

The sintering time is preferably 0.5–5 hours, and more preferably 1–3 hours. The sintering pressure is preferably 1,000–1,500 kgf/cm$^2$.

[3] Properties of Target

Because of the above features, it is possible to provide a target suitable for magnetron-type sputtering, which has a maximum permeability of 25 or less, preferably 10 or less, and has a saturation magnetization ($4\pi Is$) of preferably 10,000 G or less, more preferably 9,000 G or less. An additional effect by decreasing the maximum permeability is an increase in the amount of magnetic flux leaking from the target.

Since the bonding phase is thin, and since the metal structure of the target is uniform, thin-film layers having good properties can be stably formed even after a long period of sputtering time, without deteriorating the mechanical strength of the target.

The present invention will be explained in further detail by way of the following Examples.

EXAMPLES 1–5 AND COMPARATIVE EXAMPLE 1

An ingot of a Tb-Fe alloy (Tb: 67.4 atomic %, Fe: balance) was charged into a crucible equipped with a melt-dropping nozzle at the bottom thereof. After placing this crucible in a gas atomizing apparatus, the apparatus was evacuated to the order of $10^{-4}$ Torr, and the ingot was melted by high-frequency induction heating. When the melt temperature reached 1,200° C., the melt was dropped from the bottom of the apparatus though the nozzle while blowing a high-pressure argon gas from a gas-ejecting nozzle to produce gas-atomized Tb-Fe alloy powder.

With the same gas atomizing apparatus, pure Fe powder, pure Co powder, and an Fe-Nb alloy powder (Nb: 12 atomic %, Fe: balance) were produced in the same manner as above.

With sieves of 42 mesh, 60 mesh, 100 mesh, 140 mesh, 200 mesh and 330 mesh according to the New JIS Standards, each of the Tb-Fe alloy powder, the pure Fe powder, the pure Co powder, and the Fe-Nb alloy powder was classified to provide six classes of powder having different particle sizes as shown in Table 1. Incidentally, an average diameter $D_{50}$ was measured by a sedimentation-type particle size measurement apparatus.

TABLE 1

| No. | Average diameter $D_{50}$ (μm) | | | | |
|---|---|---|---|---|---|
| | Fe | Co | Fe—Nb | Tb—Fe* | Mixture** |
| Example | | | | | |
| 1 | 190 | 200 | 190 | 200 | 195 |
| 2 | 120 | 130 | 120 | 120 | 123 |
| 3 | 95 | 95 | 85 | 90 | 90 |
| 4 | 65 | 60 | 60 | 55 | 60 |
| 5 | 30 | 30 | 35 | 35 | 33 |
| Comparative Example | | | | | |
| 1 | 330 | 300 | 290 | 280 | 300 |

Note:
*Eutectic alloy.
**Mixture of Fe, Co, Fe—Nb and Tb—Fe.

2,291 g of the Tb-Fe alloy powder, 859 g of the pure Fe powder, 340 g of the pure Co powder, and 432 g of the Fe-Nb alloy powder were taken from the same class of powder size and mixed together in a V-type blender to provide six types of mixed powder (composition: $Tb_{24}$-$Fe_{62.2}$-$Co_{12}$-$Nb_{1.8}$, atomic %) having different particle sizes.

Each of six types of mixed powder was charged into a capsule made of soft steel, and the capsule was evacuated to a vacuum degree of $10^{-4}$ Torr at 400° C. for 4 hours and then sealed. The mixed powder sealed in the capsule was subjected to a HIP treatment under the conditions of a temperature of 675° C., lower than 690° C. which is a eutectic temperature of Tb-Co, a pressure of 1,100 kgf/cm², and a time period of 2 hours. A sintered body obtained by the HIP treatment was worked with a lathe to provide a target of 254 mm in diameter and 6 mm in thickness.

Figure 1:
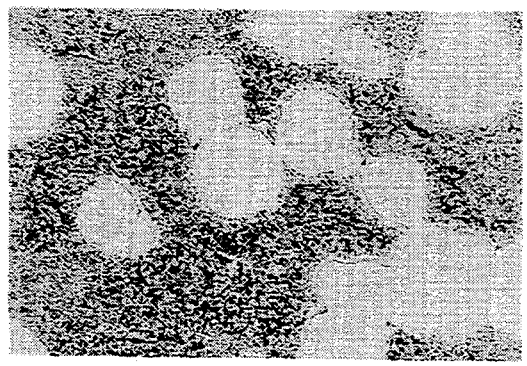
FIG. 1 is a photomicrograph (× 100) showing the microstructure of the target of the present invention (Example 2)
Figure 2:
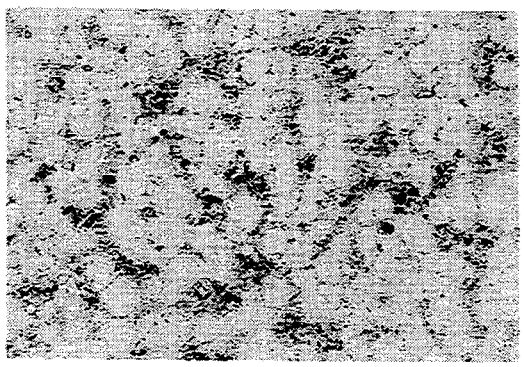
FIG. 2 is a photomicrograph (× 100) showing the microstructure of the target of the present invention (Example 5)

The microstructure of the sintered body before worked to a target was observed by an optical microscope. FIGS. 1 and 2 are photomicrographs (× 100) showing the typical microstructures of the targets of the present invention (Examples 2 and 5). An average diameter of Fe, Co and Fe-Nb particles and thickness of a diffusion-bonding phase in the microstructure of the target were calculated from the photomicrographs of FIGS. 1 and 2 by an image analysis method. As a result, it was found that particles dispersed in the target were almost in the same size as that of the starting powder because of a low sintering temperature as shown in Table 2. Also, though the diffusion-bonding phase tends to become thicker as the average diameter of the dispersed particles decreases, the thickness of the diffusion-bonding phase could be restricted to 30 μm or less.

TABLE 2

| | Average Diameter of Dispersed Particles (μm) | | | | Thickness of Bonding Phase (μm) | Oxygen Content (ppm) |
|---|---|---|---|---|---|---|
| | Fe | Co | Fe—Nb | Average | | |
| Example | | | | | | |
| 1 | 190 | 200 | 190 | 193 | 15 | 415 |
| 2 | 120 | 130 | 120 | 123 | 18 | 470 |
| 3 | 95 | 95 | 90 | 93 | 21 | 510 |
| 4 | 65 | 65 | 60 | 63 | 23 | 760 |
| 5 | 30 | 35 | 35 | 33 | 26 | 830 |
| Comparative Example | | | | | | |
| 1 | 330 | 300 | 290 | 307 | 12 | 380 |

Each sintered body before worked to a target was machined to obtain a columnar sample of 30 mm × 10 mm × 5 mm, and a B-H curve was measured at a maximum magnetic field of 10 kOe by using a DC magnetic flux meter with respect to each sample. From the B-H curve, a maximum permeability ($\mu_{max}$) and a saturation magnetization were determined. The results are shown in FIG. 4.

Figure 4:
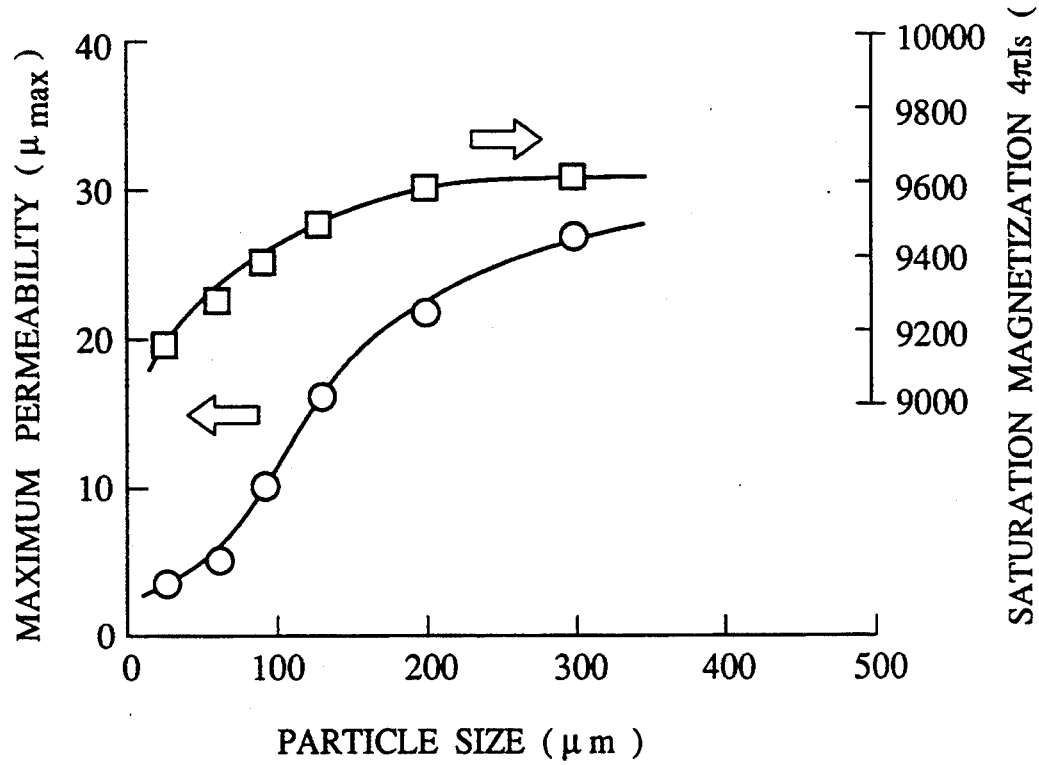
FIG. 4 is a graph showing the relations between a maximum permeability and a saturation magnetization and an average diameter of a mixture of Fe particles, Co particles and Fe-Nb alloy particles in the sintered target.

FIG. 4 shows the relations of a maximum permeability and a saturation magnetization with an average diameter of the entire particles (Fe particles, Co particles and Fe-Nb particles) dispersed in the sintered body. It is clear from the data shown in FIG. 4 that as the average diameter decreases the maximum permeability and the saturation magnetization decrease, and that particularly when the average diameter is less than 125 μm, the decrease in the maximum permeability and the saturation magnetization is remarkable, meaning that the sintered body can be used as a target suitable for a magnetron-type sputtering apparatus.

EXAMPLES 6-10 AND COMPARATIVE EXAMPLE 2

In the same manner as in Example 1, Tb-Fe alloy powder (Tb: 58.4 atomic %, Fe: balance), pure Fe powder, pure Co powder, Fe-Cr alloy powder (Cr: 15.9 atomic %, Fe: balance), and Fe-Nb alloy powder (Nb: 12 atomic %, Fe: balance) were produced. With sieves of 42 mesh, 60 mesh, 100 mesh, 140 mesh, 200 mesh and 330 mesh according to the New JIS Standards, each of the Tb-Fe alloy powder, the pure Fe powder, the pure Co powder, the Fe-Cr alloy powder, and the Fe-Nb alloy powder was classified to provide six classes of powder having different particle sizes as shown in Table 3.

1,846 g of the Tb-Fe alloy powder, 95 g of the pure Fe powder, 243 g of the pure Co powder, 706 g of the Fe-Cr alloy powder, and 1,031 g of the Fe-Nb alloy powder were taken from the same class of powder size, and mixed together in a V-type blender to provide six types of mixed powder (composition: $Tb_{18}$-$Fe_{66}$-$Co_8$-$Cr_4$-$Nb_4$, atomic %) having different particle sizes.

TABLE 3

| No. | Average Diameter $D_{50}$ (μm) | | | | | |
|---|---|---|---|---|---|---|
| | Fe | Co | Fe—Cr | Fe—Nb | Tb—Fe* | Mixture** |
| Example | | | | | | |
| 6 | 200 | 190 | 200 | 190 | 200 | 196 |
| 7 | 120 | 130 | 120 | 120 | 120 | 122 |
| 8 | 90 | 95 | 90 | 85 | 90 | 90 |
| 9 | 65 | 60 | 65 | 60 | 55 | 61 |
| 10 | 30 | 30 | 35 | 35 | 35 | 33 |
| Comparative Example | | | | | | |
| 2 | 320 | 300 | 290 | 290 | 280 | 296 |

Note:
*Eutectic alloy.
**Mixture of Fe, Co, Fe—Cr, Fe—Nb and Tb—Fe.

Each of six types of mixed powder was charged into a capsule made of soft steel, and subjected to a HIP treatment under the same conditions as in Example 1 except for a HIP temperature of 670° C. Each sintered body obtained by the HIP treatment was worked with a lathe to a target of 254 mm in diameter and 6 mm in thickness. The average diameter of particles dispersed in the target, the thickness of bonding phase and the oxygen content were measured in the same manner as in Example 1. The results are shown in Table 4.

TABLE 4

| | Average Diameter of Dispersed Particles (μm) | | | | | Thickness of Bonding Phase (μm) | Oxygen Content (ppm) |
|---|---|---|---|---|---|---|---|
| | Fe | Co | Fe—Cr | Fe—Nb | Average | | |
| Example | | | | | | | |
| 6 | 200 | 200 | 200 | 190 | 198 | 19 | 460 |
| 7 | 120 | 135 | 120 | 120 | 124 | 21 | 512 |
| 8 | 90 | 95 | 90 | 85 | 90 | 23 | 730 |
| 9 | 65 | 65 | 65 | 60 | 64 | 26 | 800 |
| 10 | 30 | 35 | 35 | 35 | 34 | 28 | 910 |
| Comparative Example | | | | | | | |
| 2 | 320 | 310 | 290 | 290 | 303 | 15 | 315 |

Figure 5:
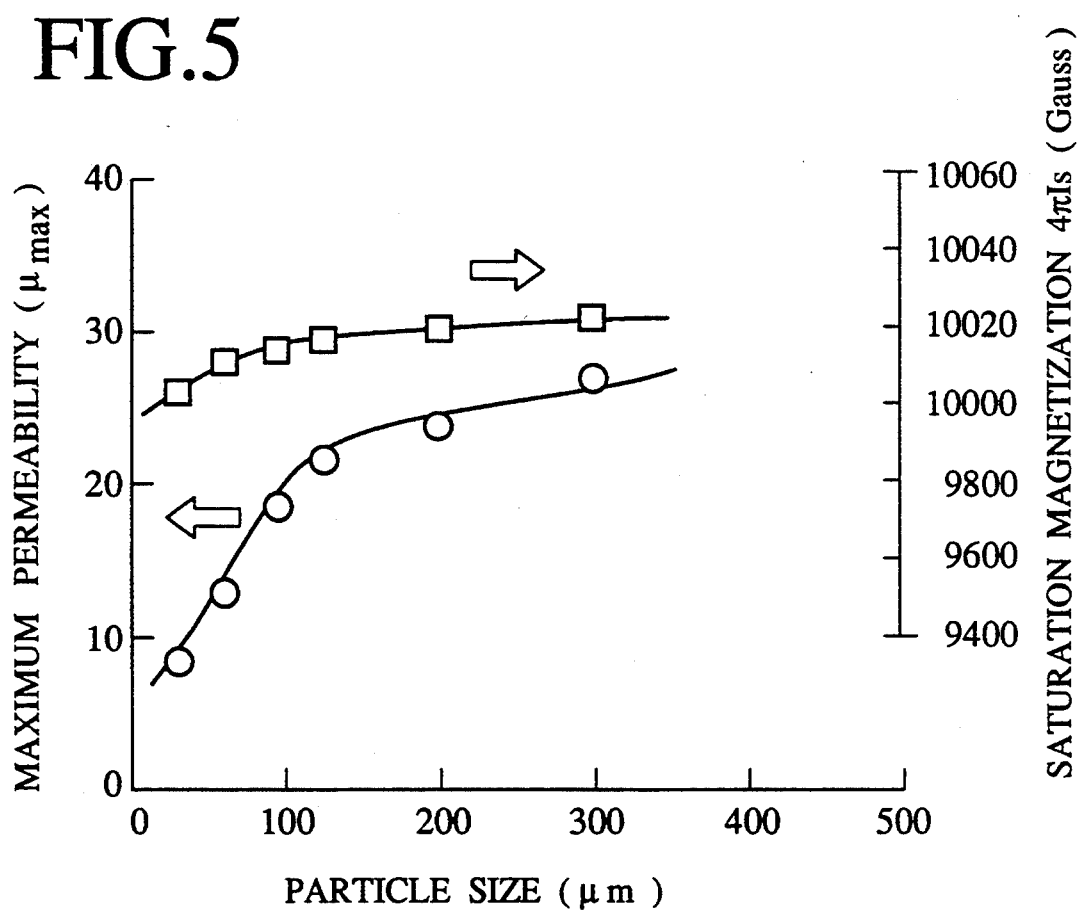
FIG. 5 is a graph showing the relations between a maximum permeability and a saturation magnetization and an average diameter of a mixture of Fe particles, Co particles, Fe-Cr alloy particles and Fe-Nb alloy particles in the sintered target.

FIG. 5 shows the relations of a maximum permeability and a saturation magnetization with an average diameter of the entire particles (Fe particles, Co particles, Fe-Cr particles and Fe-Nb particles) dispersed in the sintered body. It is clear from the data shown in FIG. 5 that as the average diameter decreases the maximum permeability and the saturation magnetization decrease, and that particularly when the average diameter is less than 125 μm, the decrease in the maximum permeability and the saturation magnetization is remarkable.

The above results indicate that the sintered body, in which Fe and Co, and Fe-Cr and Fe-Nb alloys which are alloys of an iron-group metal and a corrosion resistance-improving metal are dispersed in the form of fine particles according to the present invention, can be used as a target suitable for a magnetron-type sputtering apparatus.

EXAMPLES 11-16

In the same manner as in Example 1, Tb-Fe alloy powder (Tb: 58.4 atomic %, Fe: balance), pure Fe powder, pure Co powder, and Fe-X alloy powder (kinds and amounts of X: shown in Table 5) were produced. With sieves of 140 mesh and 200 mesh according to the New JIS Standards, each of the Tb-Fe alloy powder, the pure Fe powder, the pure Co powder, the Fe-X alloy powder was classified to provide an average diameter of about 125 μm. The Tb-Fe alloy powder, the pure Fe powder, the pure Co powder and the Fe-X alloy powder in amounts shown in Table 5 were mixed together to provide a mixed powder (composition: $Tb_{24}$-$Fe_{62}$-$Co_{12}$-$X_2$, atomic %), wherein X is Al, Ti, Ta, Pt, Pd or Cu. Incidentally, an average diameter $D_{50}$ was measured by a sedimentation-type particle size measurement apparatus on a small amount of a sample taken from each mixed powder. The average diameter $D_{50}$ is also shown in Table 5.

The resultant mixed powder was subjected to a HIP treatment under the same conditions as in Example 1. The resultant sintered body was polished to measure its microstructure by an optical microscope. The average diameter of particles (Fe, Co and Fe-X alloy) dispersed in the Tb-Fe eutectic structure, a matrix phase of the sintered body, was determined by an image analysis method. The maximum permeability of each sintered body is also shown in Table 5.

TABLE 5

| Example No. | X | Starting Powder Composition (g) | | | |
|---|---|---|---|---|---|
| | | 58.4Tb—Fe | Pure Fe | Pure Co | Fe-X* |
| 11 | Al | 2,740 | 970 | 400 | 500 (Fe-12.0Al) |
| 12 | Ti | 2,720 | 1,070 | 400 | 420 (Fe-15.0Ti) |
| 13 | Ta | 2,640 | 680 | 390 | 910 (Fe-8.0Ta) |
| 14 | Pt | 2,630 | 560 | 390 | 1,030 (Fe-7.0Pt) |
| 15 | Pd | 2,676 | 620 | 400 | 925 (Fe-7.0Pd) |
| 16 | Cu | 2,710 | 990 | 405 | 510 (Fe-12.7Cu) |

Note *: The amount of X is expressed by atomic %.

| Example No. | $D_{50}$ (μm) | Average Diameter (μm) of Particles in Sintered Body | | | Maximum Permeability ($\mu_{max}$) |
|---|---|---|---|---|---|
| | | Fe | Co | Fe-X | |
| 11 | 125 | 125 | 123 | 127 | 10.8 |
| 12 | 128 | 132 | 120 | 132 | 10.5 |
| 13 | 127 | 129 | 122 | 130 | 11.5 |
| 14 | 119 | 118 | 121 | 118 | 11.3 |
| 15 | 125 | 120 | 128 | 127 | 10.9 |
| 16 | 124 | 120 | 125 | 127 | 11.5 |

Note *: Average diameter of starting mixed powder.

Table 5 shows that the targets of the present invention have as low a maximum permeability as about 10–12, and that the maximum permeability can be effectively reduced by making the iron-group metal powder and the alloy powder of the iron-group metal and the corrosion resistance-improving metals finer.

EXAMPLE 17 AND COMPARATIVE EXAMPLE 3

In the same manner as in Example 1, Tb-Fe alloy powder (Tb: 58.4 atomic %, Fe: balance), pure Fe powder, pure Co powder, and Fe-Nb alloy powder (Nb: 12 atomic %, Fe: balance) were produced. Pure Nb powder was produced by a plasma electrode rotation method. With sieves of 140 mesh and 200 mesh according to the New JIS Standards, each of the Tb-Fe alloy powder, the pure Fe powder, the pure Co powder, the pure Nb powder and the Fe-Nb alloy powder was classified to provide an average diameter of about 100 μm as shown in Table 6.

Next, these powders were mixed by two methods (A) and (B) to provide a target composition of $Tb_{25}$-$Fe_{62}$-$Co_{11}$-$Nb_2$ (atomic %). Namely, Nb was added in the form of alloy powder of Fe-12Nb (atomic %) in the method (A), while Nb was added in the form of pure Nb powder in the method (B).

An average diameter $D_{50}$ was measured by a sedimentation-type particle size measurement apparatus on a small amount of a sample taken from each mixed powder (A), (B). The average diameter $D_{50}$ was 106 μm for (A) and 102 μm for (B).

Each of the mixed powders (A) and (B) was pressure-sintered and machined into a target of 101 mm in diameter and 3 mm in thickness in the same manner as in Example 1. The average diameter of particles dispersed in the target, the thickness of a bonding phase, the maximum permeability and the oxygen content were measured in the same manner as in Example 1. The results are shown in Table 7.

TABLE 6

| No.* | Average Diameter $D_{50}$ (μm) | | | | | |
|---|---|---|---|---|---|---|
| | Fe | Co | Nb | Fe—Nb | Tb—Fe** | Mixture*** |
| Ex. 17 | 102 | 110 | — | 108 | 104 | 106 |
| Co. Ex. 3 | 102 | 100 | 104 | — | 102 | 102 |

Note:
*Example 17 was produced by the method (A), and Comparative Example 3 was produced by the method (B).
**Eutectic alloy.
***Mixture of Fe, Co, Nb, Fe—Nb and Tb—Fe.

TABLE 7

| No.* | Average Diameter of Dispersed Particles (μm) | | | | Bonding Phase (μm) | Max. Permeability ($\mu_{max}$) | Oxygen Content (ppm) |
|---|---|---|---|---|---|---|---|
| | Fe | Co | Nb | Fe—Nb | | | |
| Ex. 17 | 102 | 110 | — | 108 | 21 | 10.5 | 580 |
| Co. Ex. 3 | 102 | 102 | 104 | — | 22 | 14.1 | 610 |

Each of the resultant targets was mounted in a magnetron-type sputtering apparatus to investigate the in-plane distributions of Tb and Nb in thin-film layers formed on a substrate of #7059 glass (101 mm diameter, and 1 mm thickness) available from Corning at a cumulative sputtering time of 12 kW.hr under the film-forming conditions of:

Base pressure: $1.0 \times 10^{-4}$ Pa or less,
Argon pressure: 1.1 Pa,
Input power: 400 W,
Distance between target and substrate: 70 mm, and
Target and substrate: Stationary.

Figure 6:
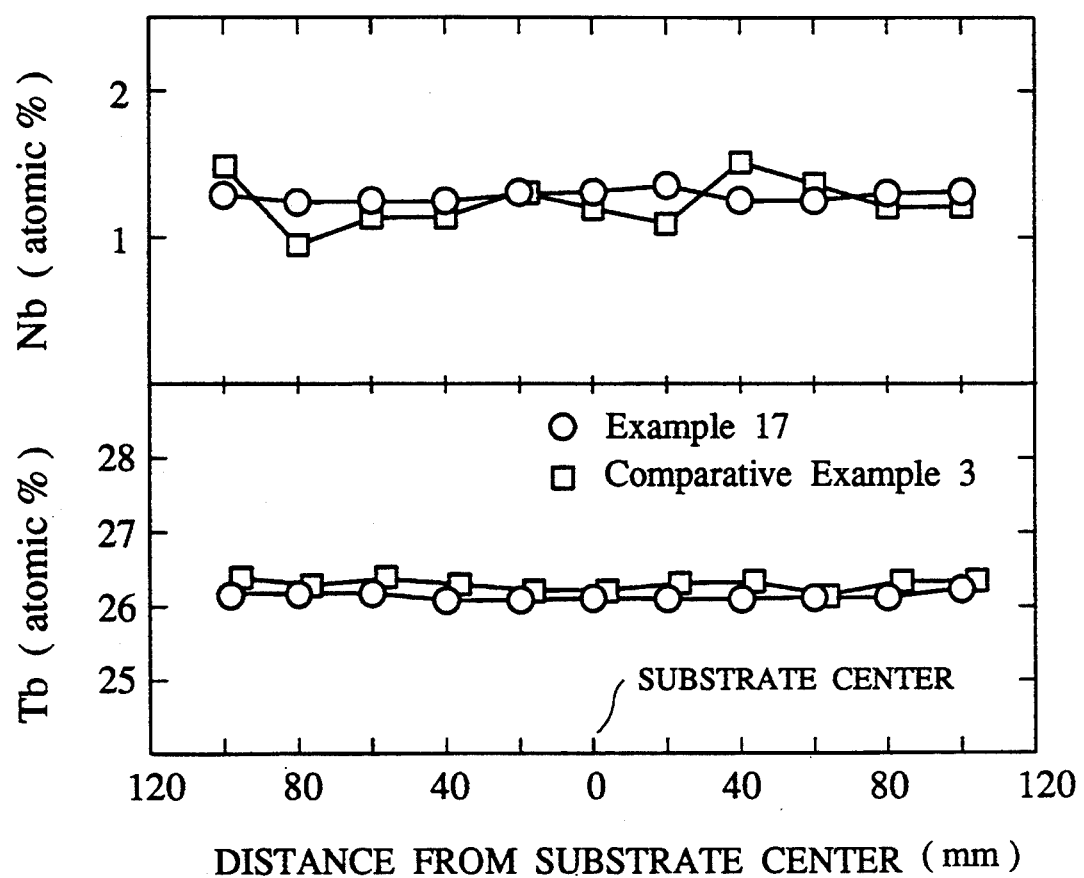
FIG. 6 is a graph showing the in-plane distributions of Nb and Tb in thin-film layers produced from the target of the present invention (Example 17) and the target of Comparative Example 3.

The concentrations of Tb and Nb in the thin-film layers were measured by an X-ray microanalyzer. The in-plane distributions of Tb and Nb were evaluated from the relations of the concentrations of Tb and Nb and a distance from a center of the substrate. The results are shown in FIG. 6. It is clear from FIG. 6 that the target (A) of Example 17 containing Fe-Nb alloy particles has a uniform in-plane distribution of Tb, and that the target (A) has a more uniform in-plane distribution of Nb than the target (B) of Comparative Example 3.

The relation between a cumulative sputtering time and a coercivity of a thin-film layer, and the relation between a cumulative sputtering time and the concentration of Nb were also investigated. Incidentally, the measurement of the coercivity was conducted by a Kerr rotation angle-measuring apparatus. The results are shown in FIGS. 7(a) and 7(b).

Figure 7:
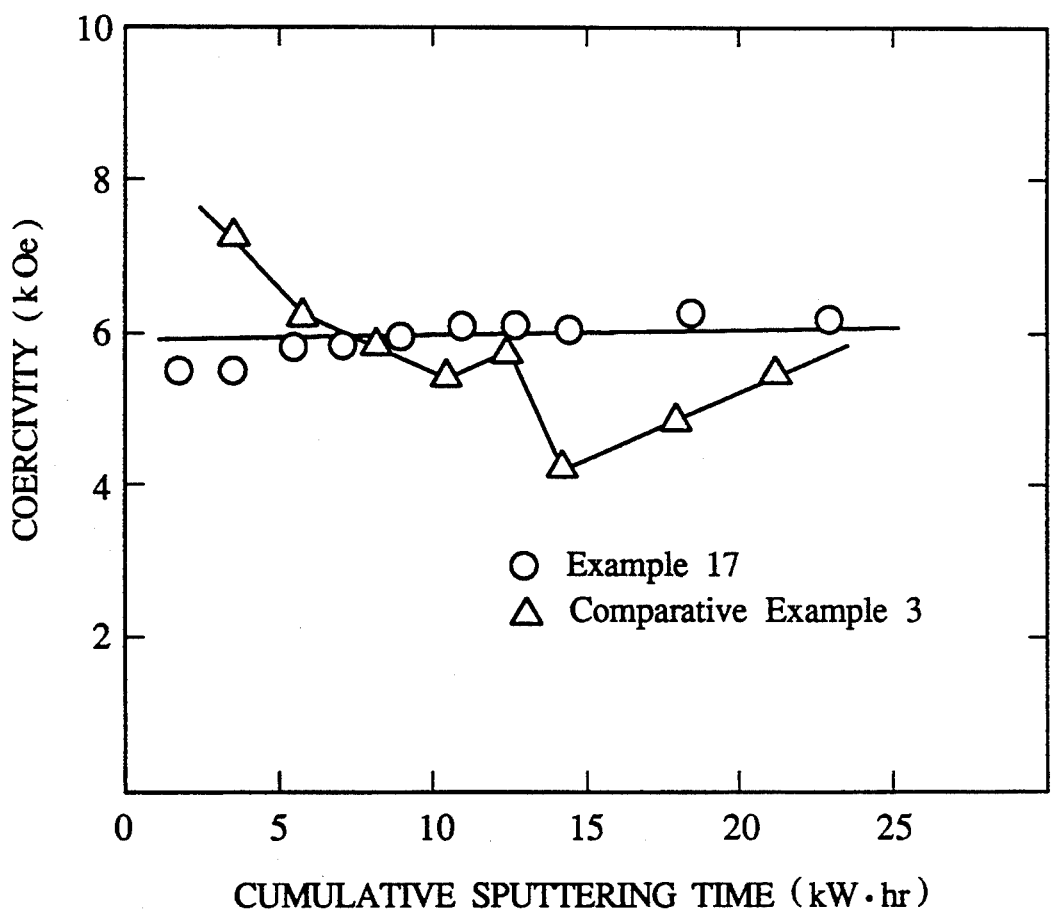
FIG. 7(a) is a graph showing the relation between a cumulative sputtering time and a coercivity of a thin-film layer produced from the target in Example 17 and Comparative Example 3.
FIG. 7(b) is a graph showing the relation between a cumulative sputtering time and the concentration Of Nb in a thin-film layer produced from the target in Example 17 and Comparative Example 3.
Figure 7:
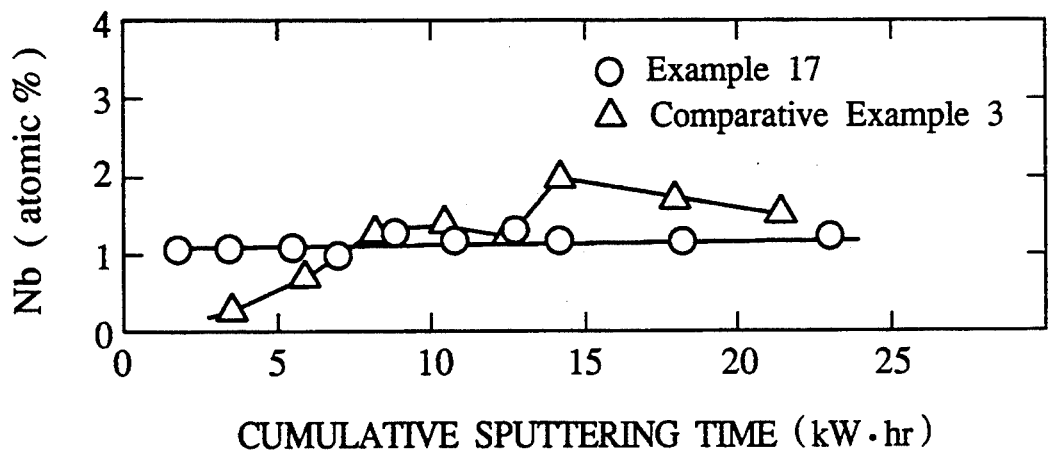

FIG. 7(a) shows the relation between a cumulative sputtering time (kW.hr) and a coercivity (kOe) of thin-film layers, and FIG. 7(b) shows the relation between a cumulative sputtering time and the concentration of Nb (atomic %). As is clear from FIGS. 7(a) and (b), in the target (B) produced by adding pure Nb powder (Comparative Example 3), the variation of the concentration of Nb is as large as ±0.8 atomic %, and the variation of the coercivity is also large. On the other hand, in the target (A) produced by adding Fe-Nb alloy powder (Example 17), the variation of the concentration of Nb is as small as ±0.2 atomic %, and the level of the coercivity is stable.

As described in detail above, since the rare earth metal-iron-group metal target of the present invention for magneto-optical recording media has low maximum permeability and saturation magnetization, it can sufficiently utilize the advantages of a magnetron-type sputtering apparatus in which magnetic flux leaks from a surface of the target, thereby increasing the use efficiency of the target.

Since the target of the present invention has a microstructure containing a eutectic structure (matrix phase) and an iron-group metal phase bonded to each other, the resultant thin-film layers have uniform distributions of rare earth metals. Also, since the corrosion resistance-improving metals exist in the form of alloys with at least one iron-group metal, the corrosion resistance-improving metals are also distributed in the thin-film layers uniformly.

Therefore, the target of the present invention can produce thin-film layers having uniform microstructures required for magneto-optical recording media, meaning that it is highly suitable for magneto-optical recording media-producing means.

What is claimed is:

1. A target for a magneto-optical recording media comprising by a sintered body having a microstructure having as a matrix phase a eutectic structure of at least one rare earth metal and at least one iron-group metal, in which first particles made of a pure iron-group metal or an alloy thereof and having an average diameter of 200 μm or less and second particles made of at least one metal selected from the group consisting of Ti, Al, Cu, Cr, Nb, Ta, Pd and Pt and at least one iron-group metal and having an average diameter of 200 μm or less are uniformly dispersed, said sintered body having a maximum permeability of 25 or less.

2. The target according to claim 1, wherein each of said first particles and said second particles has an average diameter of 125 μm or less.

3. The target according to claim 1, wherein said target has a saturation magnetization (4πIs) of 10,000 G or less.

4. The target according to claim 1, wherein an average diameter of each of said first particles and said second particles is within 20% of tolerance relative to an average diameter of a mixture of said first particles and said second particles.

5. The target according to claim 1, further comprising a bonding phase having a thickness of 30 μm or less between said eutectic structure and said first and second particles.

6. A method for producing a target for a magneto-optical recording media, comprising the steps of:

(a) rapid-quenching a melt of at least one rare earth metal and at least one iron-group metal to form a first powder having a eutectic structure;

(b) mixing said first powder with a second powder comprising a pure iron-group metal or an alloy thereof and having an average diameter of 200 μm or less, and a third powder comprising at least one metal selected from the group consisting of Ti, Al, Cu, Cr, Nb, Ta, Pd and Pt and at least one iron-group metal and having an average diameter of 200 μm or less; and (c) pressure-sintering a resulting mixed powder at a temperature lower than a liquid phase-appearing temperature.

7. The method according to claim 6, wherein each of said first powder, said second powder and said third powder has an average diameter within 20% of tolerance relative to an average diameter of a mixture of said first powder, said second powder and said third powder.

* * * * *